(12) United States Patent
Liebmann et al.

(10) Patent No.: US 11,437,376 B2
(45) Date of Patent: Sep. 6, 2022

(54) COMPACT 3D STACKED-CFET ARCHITECTURE FOR COMPLEX LOGIC CELLS

(71) Applicant: Tokyo Electron Limited, Tokyo (JP)

(72) Inventors: Lars Liebmann, Halfmoon, NY (US); Jeffrey Smith, Clifton Park, NY (US); Anton deVilliers, Clifton Park, NY (US); Daniel Chanemougame, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/849,630

(22) Filed: Apr. 15, 2020

(65) Prior Publication Data
US 2020/0381430 A1 Dec. 3, 2020

Related U.S. Application Data

(60) Provisional application No. 62/855,374, filed on May 31, 2019.

(51) Int. Cl.
*H01L 27/092* (2006.01)
*H01L 29/08* (2006.01)
(Continued)

(52) U.S. Cl.
CPC ...... *H01L 27/0922* (2013.01); *H01L 23/5286* (2013.01); *H01L 23/535* (2013.01); *H01L 29/0847* (2013.01); *H03K 19/215* (2013.01)

(58) Field of Classification Search
CPC . H01L 27/0688; H01L 27/092; H01L 27/088; H01L 21/08221; H01L 21/823871;
(Continued)

(56) References Cited

U.S. PATENT DOCUMENTS 8,314,001 B2  11/2012  Christensen et al.
8,754,417 B2  6/2014  Christensen et al.
(Continued)

FOREIGN PATENT DOCUMENTS

KR  10-2018-0058673 A  6/2018

OTHER PUBLICATIONS

International Search Report and Written Opinion dated Sep. 15, 2020 in PCT/US2020/034134, citing documents AA through AD and AO therein, 9 pages.

*Primary Examiner* — Michael M Trinh
(74) *Attorney, Agent, or Firm* — Oblon, McClelland, Maier & Neustadt, L.L.P.

(57) ABSTRACT

A 3D IC includes a substrate having a substrate surface, a first stack of semiconductor devices stacked along a thickness direction of the substrate, and a second stack of semiconductor devices stacked along the thickness direction of the substrate and provided adjacent to the first stack in a direction along the substrate surface. Each semiconductor device of the first and second stack includes a gate and a pair of source-drain regions provided on opposite sides of the respective gate, and each gate of the first and second stack is a split gate. A gate contact is physically connected to a first split gate of a first one of the semiconductor devices. The gate contact forms at least part of a local interconnect structure that electrically connects the first semiconductor device to a second semiconductor device in the 3D IC.

21 Claims, 15 Drawing Sheets

(51) Int. Cl.
*H01L 23/535* (2006.01)
*H01L 23/528* (2006.01)
*H03K 19/21* (2006.01)

(58) Field of Classification Search
CPC ..... H01L 21/823475; H01L 21/823437; H01L 21/823828; H03K 19/215
See application file for complete search history.

(56) References Cited

U.S. PATENT DOCUMENTS

| | | | |
|---|---|---|---|
| 9,570,395 B1* | 2/2017 | Sengupta | H01L 29/0665 |
| 9,646,989 B1 | 5/2017 | Yoshimizu et al. | |
| 9,941,200 B1 | 4/2018 | Roy | |
| 10,109,646 B1 | 10/2018 | Badaroglu | |
| 10,199,409 B2 | 2/2019 | Roy | |
| 10,236,292 B1* | 3/2019 | Frougier | H01L 21/743 |
| 10,608,109 B2* | 3/2020 | Cheng | H01L 29/0847 |
| 10,692,935 B2 | 6/2020 | Kwon et al. | |
| 10,811,415 B2* | 10/2020 | Sengupta | H01L 29/66795 |
| 2005/0184292 A1* | 8/2005 | Kwak | H01L 27/1108 257/70 |
| 2011/0248349 A1 | 10/2011 | Christensen et al. | |
| 2013/0001701 A1 | 1/2013 | Christensen et al. | |
| 2015/0017767 A1* | 1/2015 | Masuoka | H01L 27/1116 438/211 |
| 2016/0071851 A1* | 3/2016 | Masuoka | H01L 29/7827 257/401 |
| 2017/0076996 A1* | 3/2017 | Masuoka | H01L 27/092 |
| 2017/0141122 A1 | 5/2017 | Yoshimizu et al. | |
| 2017/0345909 A1* | 11/2017 | Masuoka | H01L 27/092 |
| 2018/0090435 A1 | 3/2018 | Roy | |
| 2018/0122846 A1 | 5/2018 | Roy | |
| 2019/0006424 A1 | 1/2019 | Kwon et al. | |
| 2019/0131230 A1* | 5/2019 | Guo | H01L 23/481 |
| 2020/0075489 A1* | 3/2020 | Liebmann | H01L 25/0657 |
| 2020/0135718 A1* | 4/2020 | Liebmann | H01L 23/535 |
| 2021/0020628 A1* | 1/2021 | Oh | H01L 27/0688 |
| 2021/0242125 A1* | 8/2021 | Do | H01L 27/0688 |

* cited by examiner

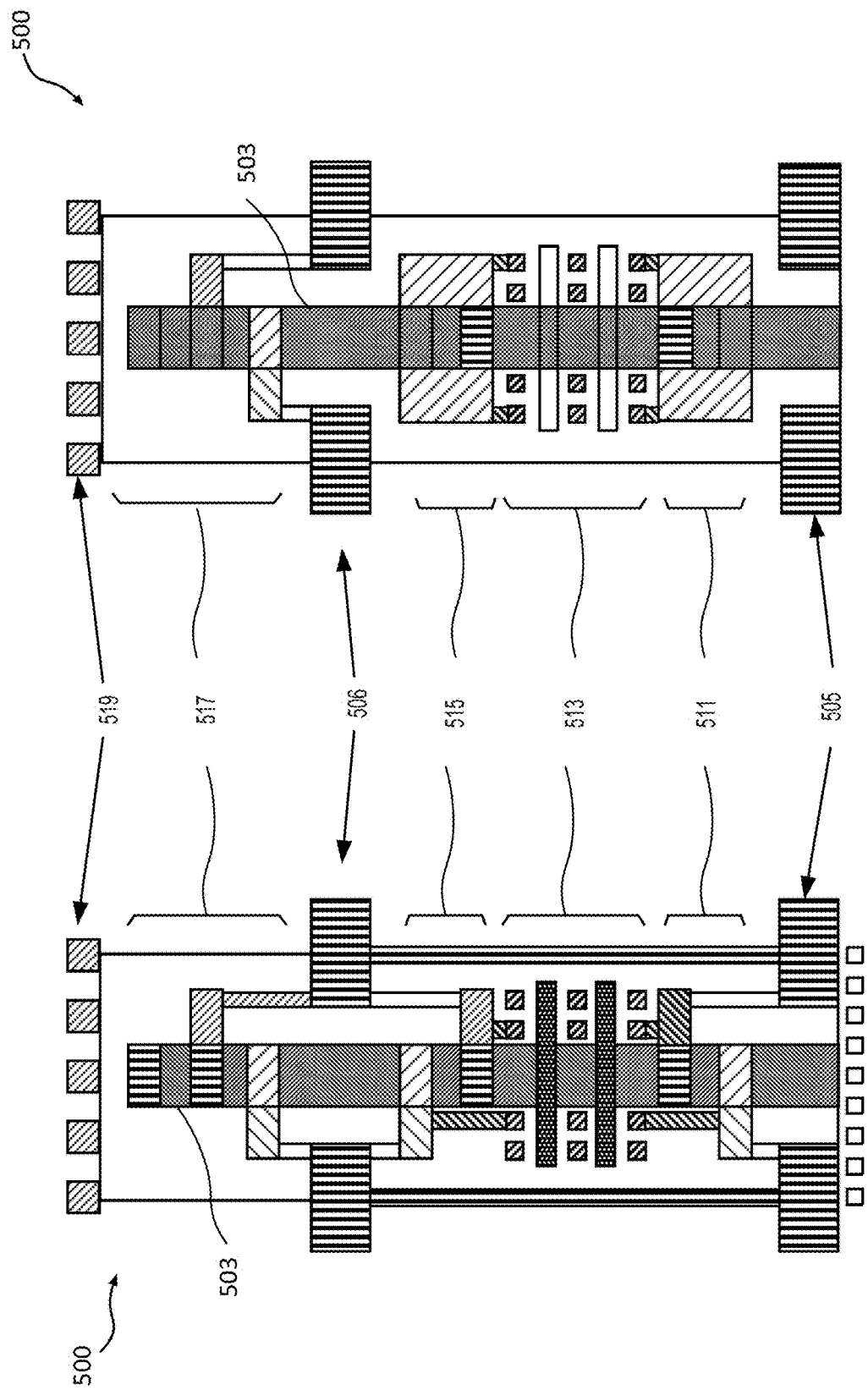

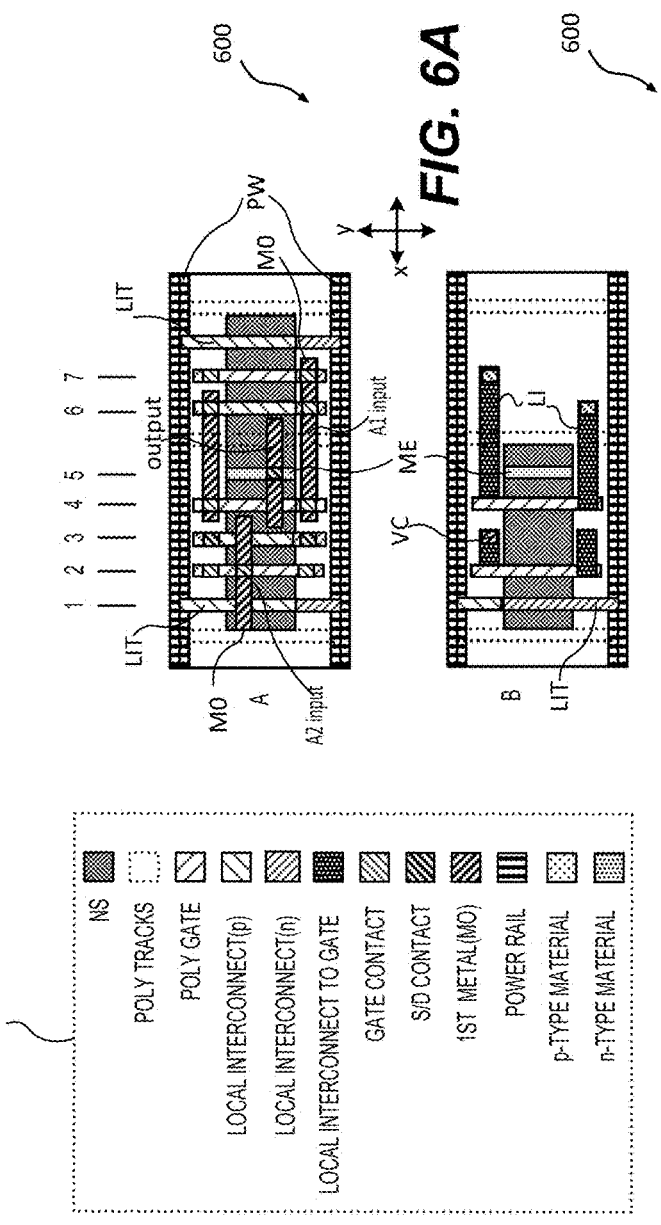
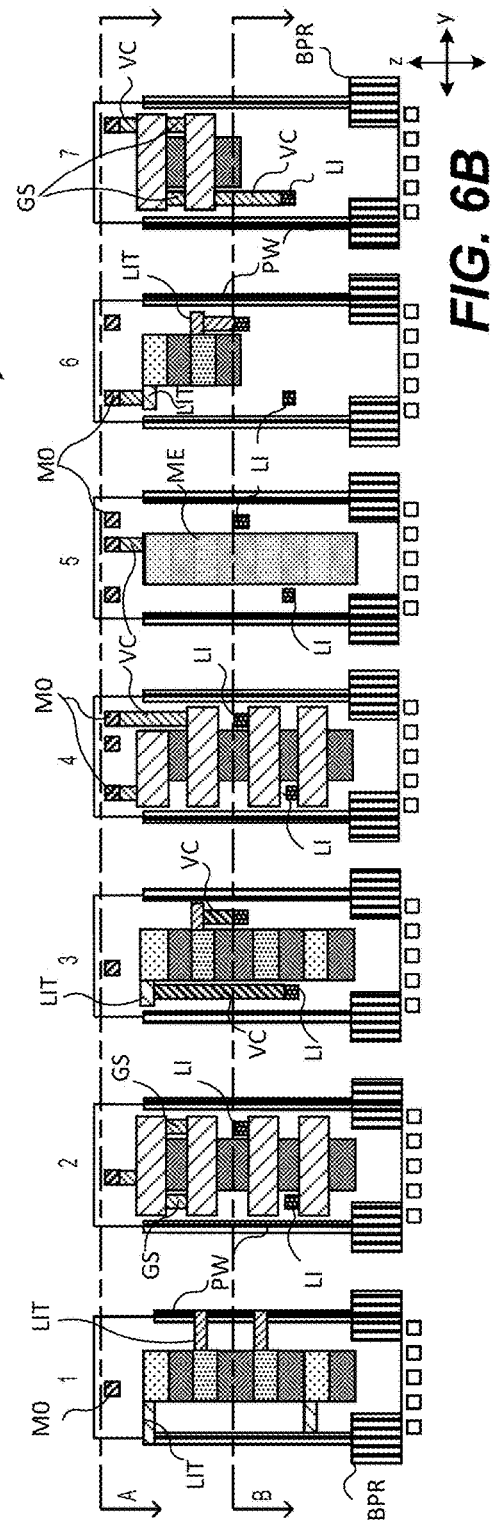
FIG. 6A
FIG. 6B

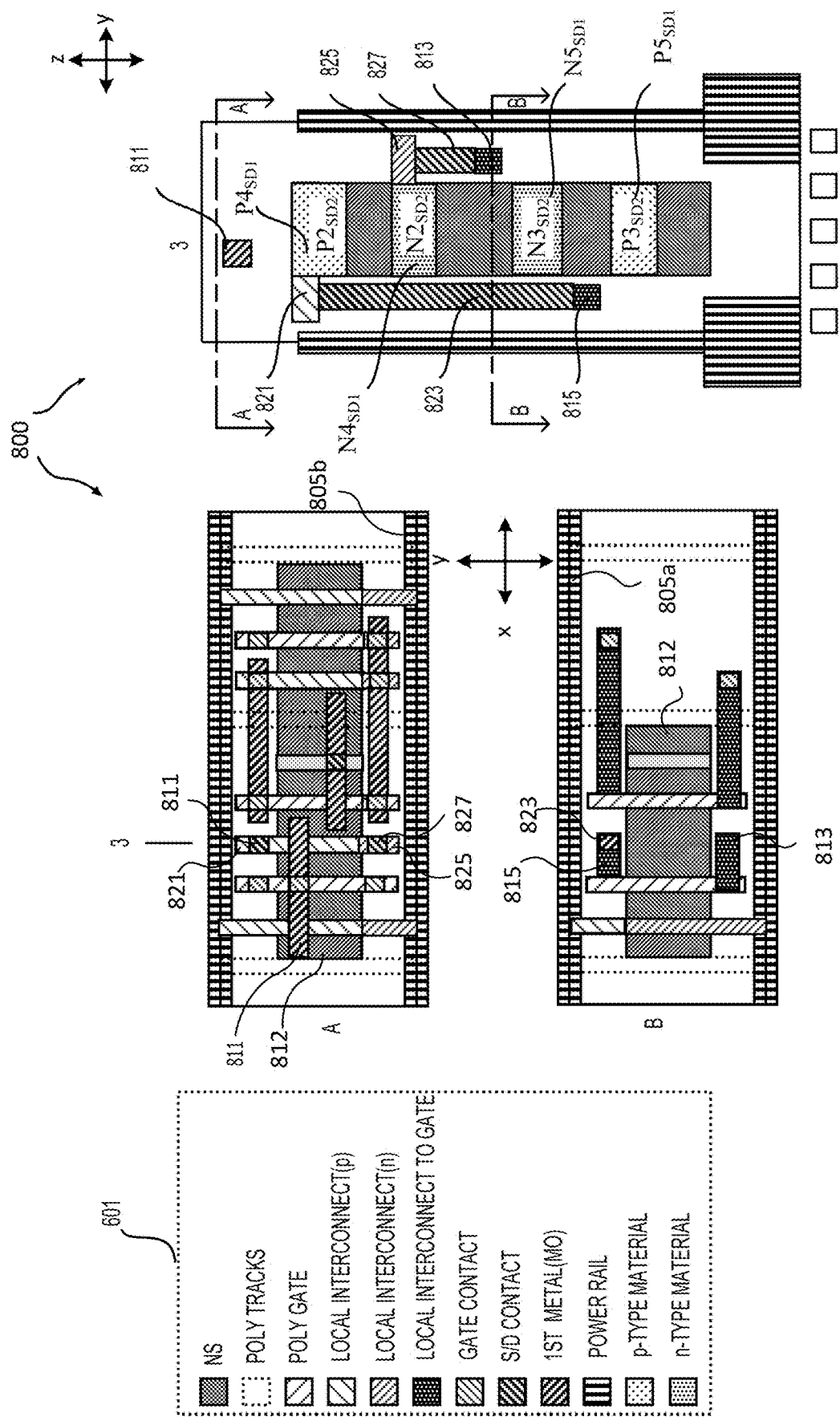

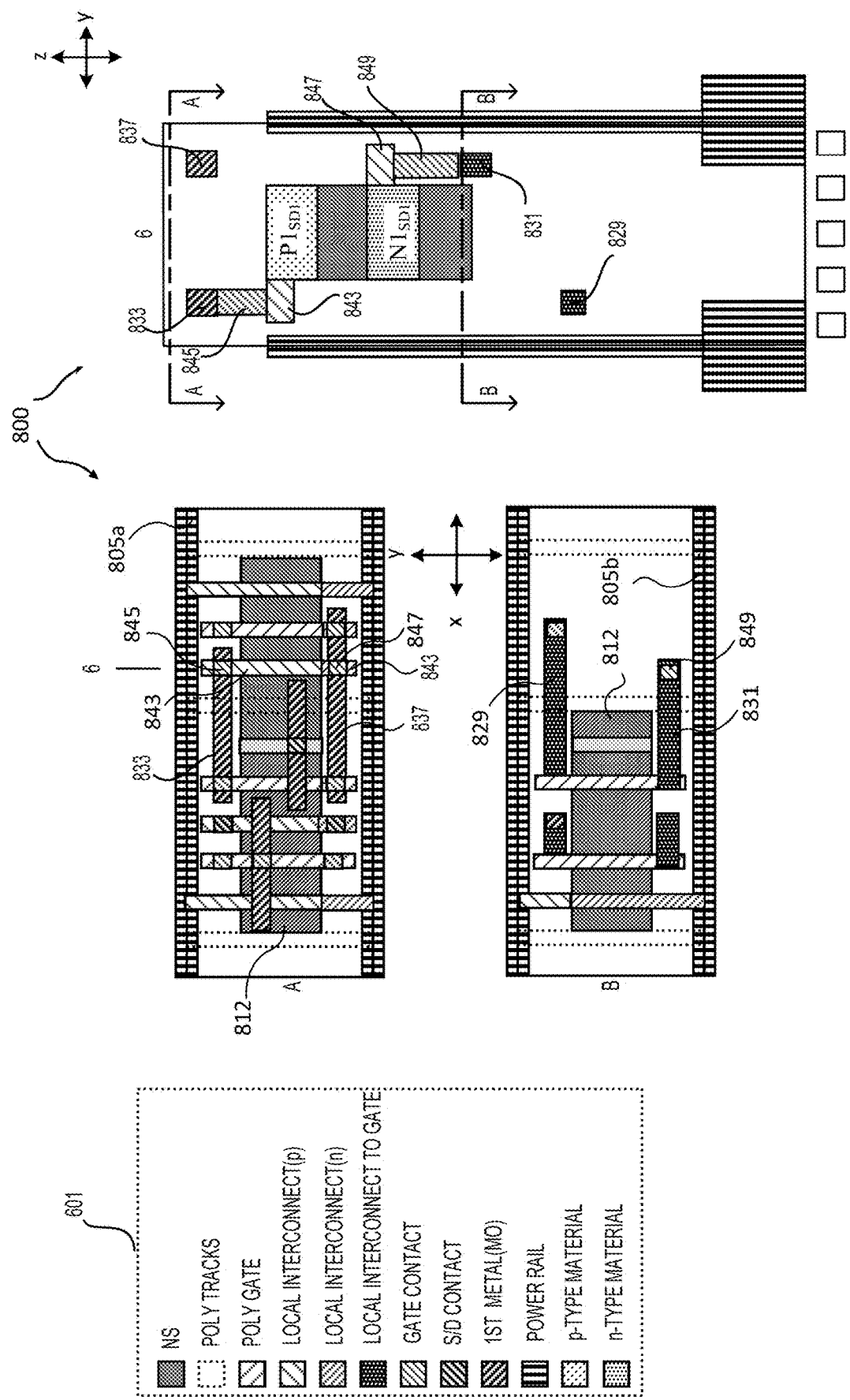

COMPACT 3D STACKED-CFET ARCHITECTURE FOR COMPLEX LOGIC CELLS

CROSS REFERENCE TO RELATED APPLICATION DATA

This application priority under 35 U.S.C. § 119(e) from U.S. Provisional Patent Application No. 62/855,374 entitled "Compact 3D Stacked CFET Architecture for Complex Logic Cells," filed May 31, 2019, the entire disclosure of which incorporated herein by reference.

FIELD OF THE INVENTION

The disclosure relates to microelectronic devices including semiconductor devices, transistors, and integrated circuits, including the design and methods of microfabrication of such devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Integrated circuits are widely used in the electronics industry to provide electronic devices such as smart phones, computers, and the like. Integrated circuits (ICs) include many semiconductor devices, such as transistors, capacitors and the like, which are interconnected by wiring on a semiconductor substrate. There is an ever increasing demand for smaller and faster ICs that support a greater number of complex functions for electronics devices. This demand has led to the semiconductor manufacturing industry scaling down the area of ICs on the substrate, while also improving performance and power consumption efficiencies for the IC.

In the manufacture of a semiconductor ICs (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors of the IC have been created in one plane, with wiring/metallization of the IC formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of ICs.

SUMMARY

Techniques herein enable transistor-on-transistor 3D integration without increasing pin density (i.e., the density of access points into a logic cell) to a point where cell-scaling gains are overshadowed by route-ability degradation due to pin access congestion. According to an aspect (1) of the disclosure, a three-dimensional (3D) integrated circuit (IC) is provided. The 3D IC includes a substrate having a substrate surface and a power rail provided in the substrate. A semiconductor device is provided in the substrate and positioned over the power rail along a thickness direction of the substrate which is substantially perpendicular to the substrate surface, the first semiconductor device having a first gate and a first pair of source-drain regions provided on opposite sides of the first gate. A second semiconductor device is provided in the substrate and stacked over the first semiconductor device along the thickness direction, the second semiconductor device having a second gate and a second pair of source-drain regions provided on opposite sides of the second gate, the first gate being physically separated from the second gate. A conductive gate-to-gate strap connection extends from the first gate to the second gate such that the first gate is electrically connected to the second gate.

An aspect (2) includes the 3D IC of aspect (1), wherein the gate-to-gate strap includes at least one vertical contact extending from the first gate to the second gate.

An aspect (3) includes the 3D IC of aspect (2), wherein the first and second gates are stacked collinearly.

An aspect (4) includes the 3D IC of aspect (3), wherein the gate-to-gate strap includes a plurality of the vertical contacts which are physically separated from each other.

An aspect (5) includes the 3D IC of aspect (1), wherein the first and second gates are stacked in a staggered arrangement.

An aspect (6) includes the 3D IC of aspect (5), further including a first gate contact connected to the first gate, and a second gate contact connected to the second gate, the first gate contact having a greater vertical height as compared to the second gate contact.

An aspect (7) includes the 3D IC of aspect (6), further including a wiring layer provided in the substrate and positioned over the second semiconductor device along the thickness direction, wherein the first and second gate contacts each extend vertically to connect with the wiring layer.

An aspect (8) includes the 3D IC of aspect (1), further including a merged epitaxial structure which connects a source-drain region of the first semiconductor device with a source-drain region of the second semiconductor device.

An aspect (9) includes the 3D IC of aspect (8), wherein the merged epitaxial structure is configured to provide a common output pin from the 3D IC.

An aspect (10) includes the 3D IC of aspect (1), further including power wall extending vertically from the power-rail.

An aspect (11) includes a 3D IC including a substrate having a substrate surface, a first stack of semiconductor devices stacked along a thickness direction of the substrate, and a second stack of semiconductor devices stacked along the thickness direction of the substrate and provided adjacent to the first stack in a direction along the substrate surface. Each semiconductor device of the first and second stack includes a gate and a pair of source-drain regions provided on opposite sides of the respective gate, and each gate of the first and second stack is a split gate. A gate contact is physically connected to a first split gate of a first one of the semiconductor devices, wherein the gate contact forms at least part of a local interconnect structure that electrically connects the first semiconductor device to a second semiconductor device in the 3D IC.

An aspect (12) includes the 3D IC of aspect (11), wherein the first and second semiconductor devices are sequentially stacked in the first stack of semiconductor devices.

An aspect (13) includes the 3D IC of aspect (12), wherein the gate contact is a gate-to-gate strap that extends vertically from the first split gate to a second split gate of the second semiconductor device such that the first and second semiconductor devices are electrically connected.

An aspect (14) includes the 3D IC of aspect (13), further including a wiring layer provided over the first and second stacks of semiconductor devices in the thickness direction; and a vertical contact extending vertically from the second split gate to provide a common input to the first and second semiconductor devices.

An aspect (15) includes the 3D IC of aspect (12), wherein the first split gate is staggered in relation to a second split gate of the second semiconductor device.

An aspect (16) includes the 3D IC of aspect (15), further including a wiring layer provided over the first and second stacks of semiconductor devices in the thickness direction, a first vertical contact extending vertically from the first split gate to the wiring layer, and a second vertical contact extending vertically from the second split gate to the wiring layer, wherein the first vertical contact has greater height than the second vertical contact.

An aspect (17) includes the 3D IC of aspect (11), wherein the first and second semiconductor devices are provided in the first and second stacks respectively.

An aspect (18) includes the 3D IC of aspect (17), wherein the local interconnect structure electrically connects the first split gate to a second split gate in the second stack of semiconductor devices.

An aspect (19) includes the 3D IC of aspect (18), wherein the gate contact includes a horizontal interconnect structure that extends form the first stack to the second stack along the substrate surface.

An aspect (20) includes the 3D IC of aspect (18), wherein the local interconnect structure electrically connects the first split gate to a source-drain region of a semiconductor device in the second stack.

An aspect (21) includes the 3D IC of aspect (20), wherein the gate contact includes a horizontal interconnect structure that extends form the first stack to the second stack along the substrate surface.

An aspect (22) includes the 3D IC of aspect (21), further including a local interconnect tab extending from the source-drain region in the direction along the substrate surface, wherein the vertical contact extends vertically from the first split gate to the local interconnect tab.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is a vertical section view representing source-drain planes of the cell in FIG. 5;

FIG. 5C is a vertical section view representing gate planes of the cell in FIG. 5A;

FIGS. 6A and 6B illustrate an overview of technology architecture that compactly renders complex logic cells such as the XOR logic function while minimizing pin access congestion problems in accordance with embodiments of the disclosure;

FIG. 8C is a detailed view of vertical section 3 of an XOR cell in accordance with embodiments of the present disclosure;

FIG. 8F is a detailed view of vertical section 6 of an XOR cell in accordance with embodiments of the present disclosure.

DETAILED DESCRIPTION

Figure 1:
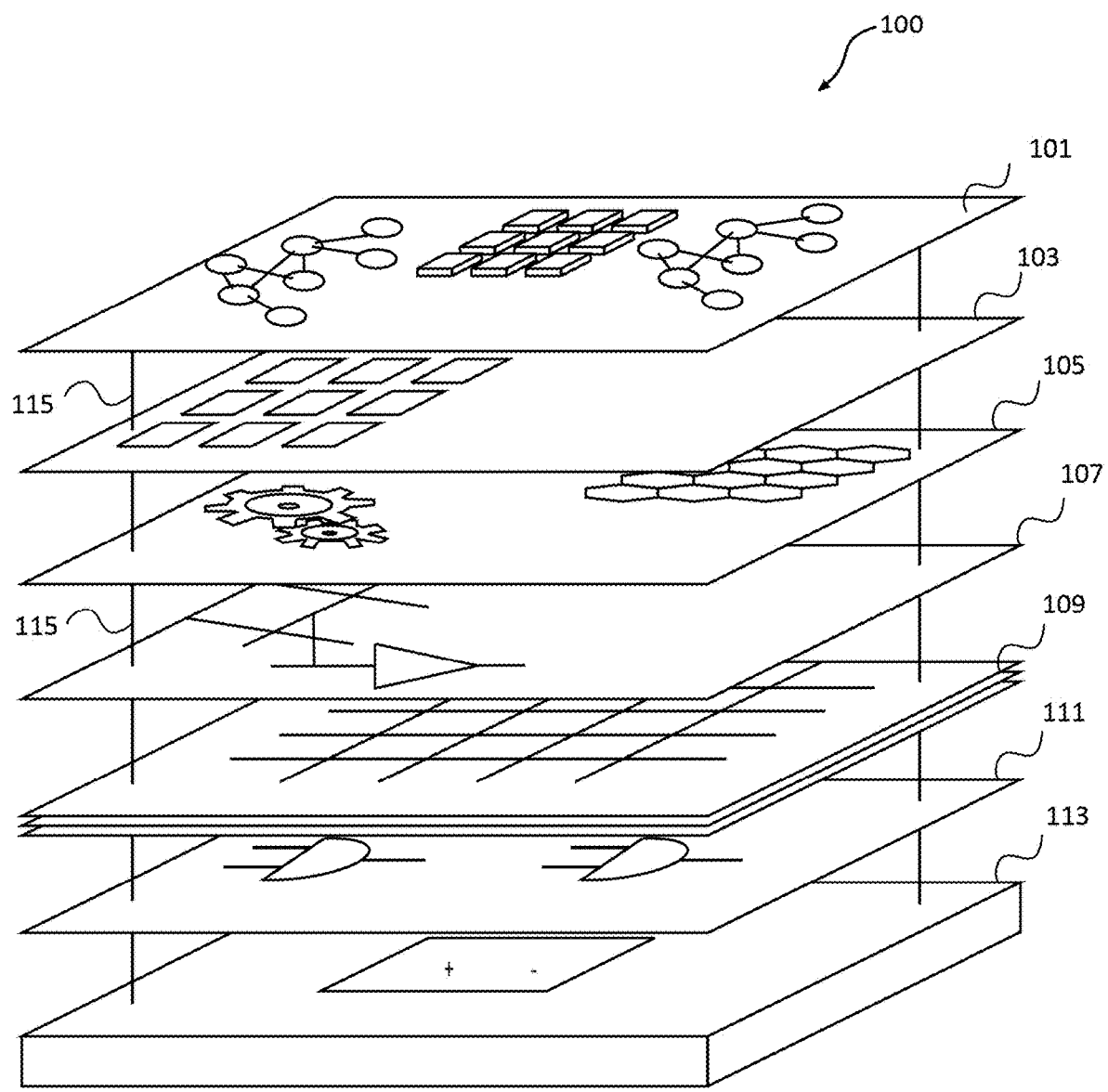
FIG. 1 shows an example of a heterogeneous 3D integration.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, semiconductor device fabricators have expressed a desire for three-dimensional (3D) semiconductor circuits in which transistors are stacked on top of each other as another means of scaling ICs, in addition to conventional 2D scaling. A 3D integration, i.e. the vertical stacking of semiconductor devices, aims to overcome 2D scaling limitations by increasing transistor density in volume rather than area. Although device stacking has been successfully demonstrated and implemented by the flash memory industry with the adoption of 3D NAND, application to random logic designs is substantially more difficult. 3D integration for logic chips such as CPUs (central processing units), GPUs (graphics processing units), FPGA (field programmable gate arrays) and SoCs (System on a chip) is being pursued primarily by two approaches: one approach is heterogeneous stacking, and the other approach is more of a homogeneous stacking.

FIG. 1 shows an example of a heterogeneous 3D intergration using wafer/chip stacking and through silicon via (TSV) technology as disclosed in Process Integration Aspects enabling 3D sequential stacked planar and FINfet Technology, Anne VanDooren, IMEC PTW Spring 2018. In this 3D approach, each chip is optimized in design and manufacturing for a different specific task, and then 3D integration is used as an efficient packaging technology to build a stacked SoC. For example, as schematically shown in FIG. 1, IC 100 includes chip 101 that may be optimized to contain chemical and biological sensors, and chip 103 is dedicated to other sensors and imagers, while chip 105 includes nano-devices and MEMS devices. Chip 107 can be optimized for RF, ADC and/or =DAC functions, while chips 109 can provide a memory stack. Chip 111 may be designed for processors and 113 dedicated to providing energy/power to the overall IC. TSVs 115 are provided to integrate the various functional chips into a compact package 100. Details of heterogeneous integration approaches are provided in the Heterogeneous Integration Roadmap, 2019 Edition published October 2019 at eps.iee.org/hir.

Figure 2:
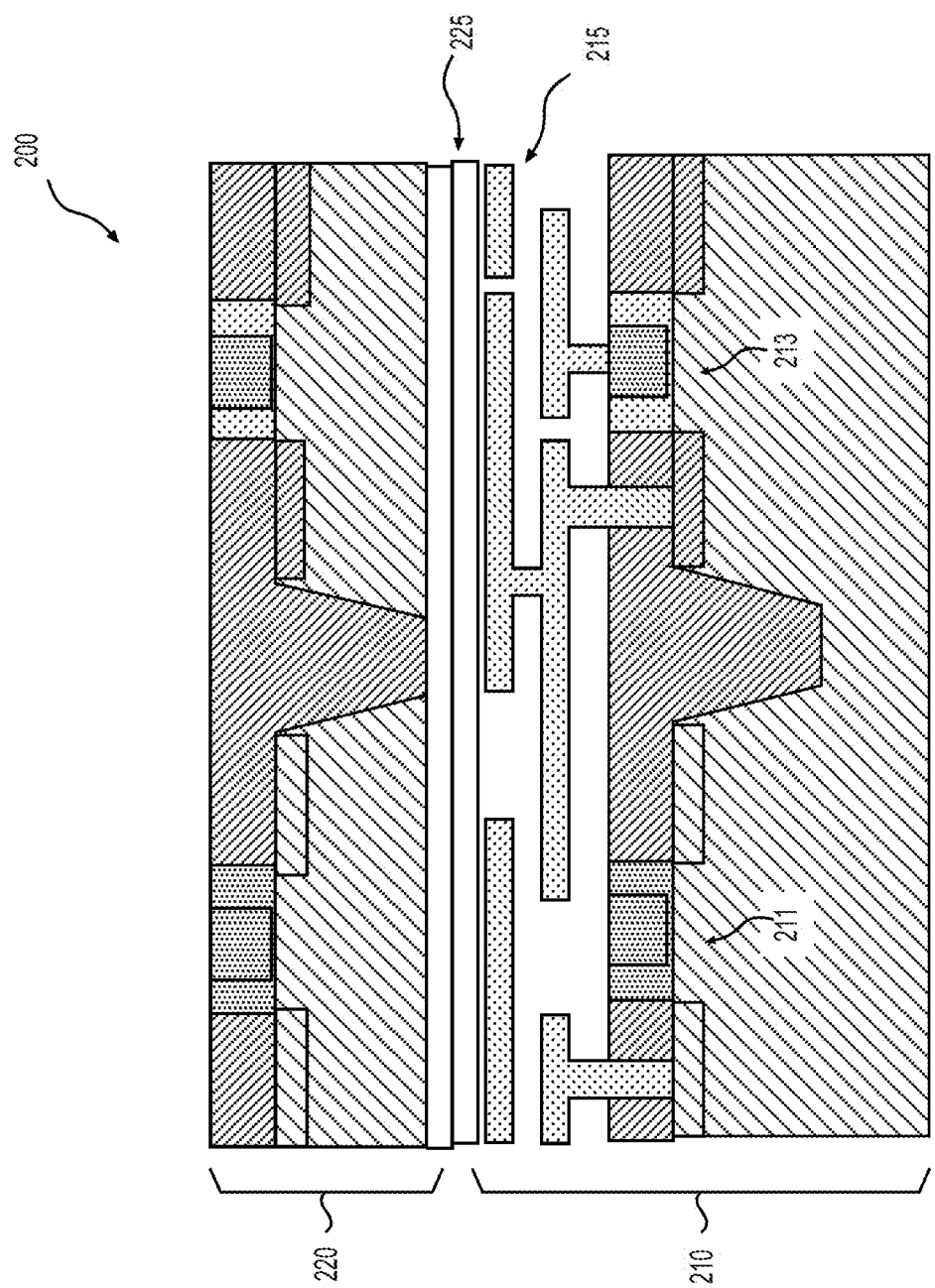
FIG. 2 shows an example of the homogeneous stacking.

FIG. 2 shows an example of the homogeneous stacking approach as disclosed in *Monolithic 3D IC: The Time is Now*, Brian Cronquist and Zvi Or-Bach, Monolithic, 2014 Intl. Workshop on Data-Abundant System Technology, April 2014. This approach employs a wafer bonding process to overcome density loss associated with micron-sized TSVs that are used in chip stacking. With the bonding approach, a base wafer 210 is processed to form devices such as nMOS 211 and pMOS 213, and several layers of metallization/wiring 215. Then, a thinned SoI (Silicon on insulator) layer, often called a transferred donor layer, 220 is positioned on top of the base wafer 210 and bonded thereto by way of an oxide-oxide bond 225 to form the completed structure 200. Better inter-tier connectivity can be achieved with this wafer bonding method due to significantly smaller dimensions in the required via (~100 nm pitch) as compared to the chip stacking heterogeneous approach noted above. However, the present inventors recognized that this approach is not a true monolithic integration because independently processed wafers or wafer segments are stacked on top of each other. Thus, the wafer bonding method does not offer a true scaling solution for semiconductor fabrication. Moreover, process complexity and cost overhead associated with this wafer bonding process fall short of the scaling targets associated with true monolithic 3D integration.

True monolithic 3D integration involves fabricating multiple device levels on a same silicon substrate. 3D NAND is an example of true monolithic integration of memory chips. True monolithic integration of 3D logic is more challenging in part because of a large variety of wiring needed to connect and functionalize each device layer.

Techniques herein provide device architectures and corresponding local interconnect structures that enable efficient and compact monolithic integration of transistors into 3D logic functions. Techniques include a comprehensive set of vertical and lateral local interconnect constructs that allow an efficient and compact design of complex logic cells in a transistor-on-transistor 3D integration process.

As described above, approaches to 3D integration include wafer stacking using through-silicon-vias (TSV), sequential 3D bonding, and monolithic (true monolithic) 3D integration in which device levels are built from a single silicon substrate. 3D integration approaches can be further classified using a granularity of units being stacked, i.e., a macro-on-macro 3D approach, a gate-on-gate 3D approach, and a transistor-on-transistor 3D approach. In a macro-on-macro 3D approach, entire functional blocks or logic macros are being stacked. Stacking entire blocks can be implemented well with sparse connectivity, and thus a TSV-based approach can be effective. In gate-on-gate 3D approach, a functional block is split across two tiers by stacking standard cells (the fundamental building blocks on logic designs) on top of each other and wiring levels can be placed in a space between device tiers. FIG. 5C shows a 3D architecture with five wiring levels between device planes, as will be discussed further below. While it is possible to implement gate-on-gate using sequential 3D, this approach shows very limited scaling benefit. Implementing gate-on-gate 3D in a monolithic integration approach is made challenging by the large number of wiring levels that are required to be integrated in between the two device levels to successfully complete each cells intra-cell wiring as well as the required cell-to-cell wiring.

In transistor-on-transistor 3D approach, individual transistors are stacked vertically to form a very high density of devices per volume. While this approach holds a lot of promise for cost effective scaling, one concern is that forming simple logic cells (NAND, NOR, AOI, . . . ) with stacked transistors reduces the cell's footprint to a point where it becomes inefficient or challenging to connect a given cell to a remaining design in a failure commonly referred to as pin access congestion. That is, one challenge with transistor-on-transistor 3D integration is that vertically stacked transistors can become inherently difficult to connect to from wiring levels sitting above the device plane.

Figure 3:
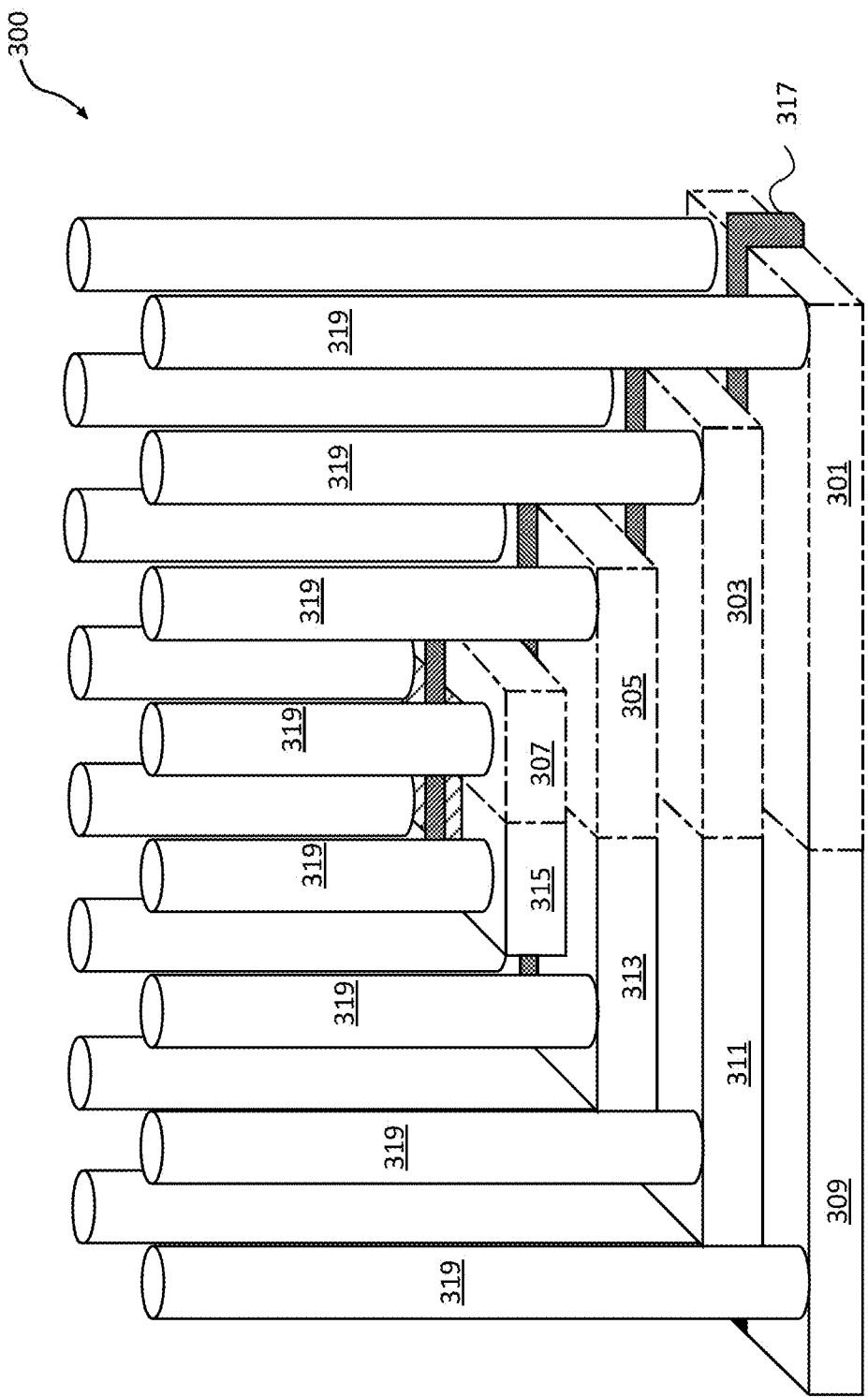
FIG. 3 shows a 3D IC having relatively poor area scaling.

This can lead to either poor cell area scaling (in the case of staggered transistor contacts), or excessive pin density at the top of the cell resulting in unrouteable wiring congestion. FIG. 3 shows a 3D IC having relatively poor area scaling. As seen, the IC structure 300 includes a cell including stacked n-type transistors 301-307 and stacked p-type transistors 309-315, and a cell boundary 317. Pins 319 provide connection from a wiring level to the gates of each transistor. As seen, accessing stacked devices from wiring levels above can require costly pyramidal stair-casing of the poly-gates.

Techniques herein enable transistor-on-transistor 3D integration without increasing pin density (i.e., the density of access points into a logic cell) to a point where cell-scaling gains are overshadowed by route-ability degradation due to pin access congestion.

Figure 4:
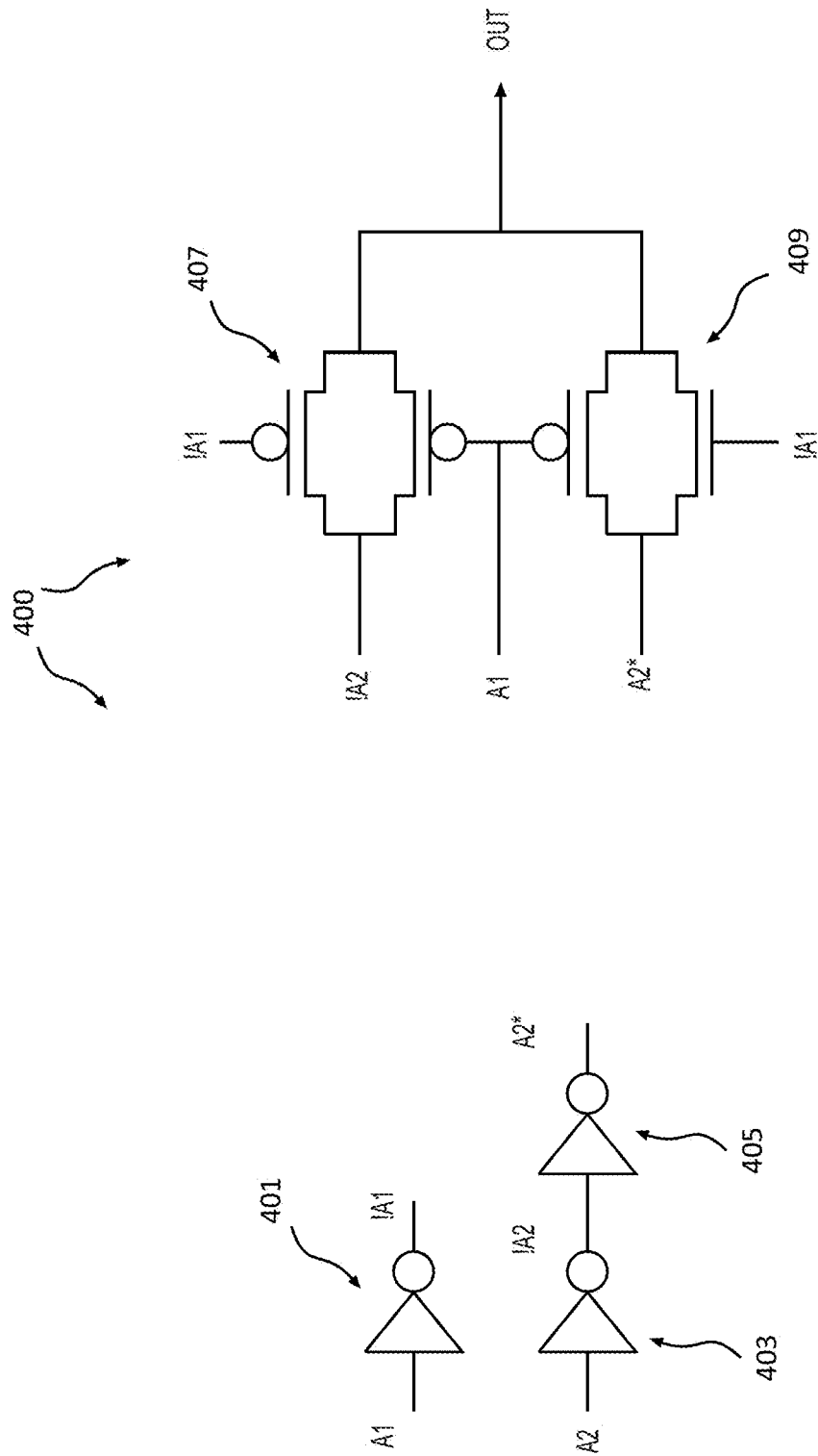
FIG. 4 is a logic diagram of a two input XOR logic circuit that may be implemented by techniques disclosed herein.

Designs herein avoid logic cells with large numbers of inputs relative to their transistor count (e.g. AOI22 with 4 inputs on 4 transistors) by pre-synthesizing more complex logic cells that internally string together multiple operations. This includes building logic primitives with a large transistor to input signal count. This approach is known as large-block synthesis and has been explored in the industry. Techniques herein also use novel local interconnect constructs that allow transistor arrangements in three dimensions to be efficiently wired in these higher order logic cells. The XOR (exclusive OR) logic function is an example of a complex or higher order logic cell. FIG. 4 is a logic diagram of a two input XOR logic circuit that may be implemented by techniques disclosed herein. As seen, the A1 input of the XOR circuit 400 is provided to inverter 401, and A2 input is provided to inverter 403 which is series connected to inverter 405. Inverters 401, 403 and 405 may each be implemented as complementary FETs. Outputs of the inverters 401, 403 and 405 are provided to additional complementary FET circuits 407 and 409, which are cross connected to provide the logic output for the XOR cell 400.

Figure 5A:
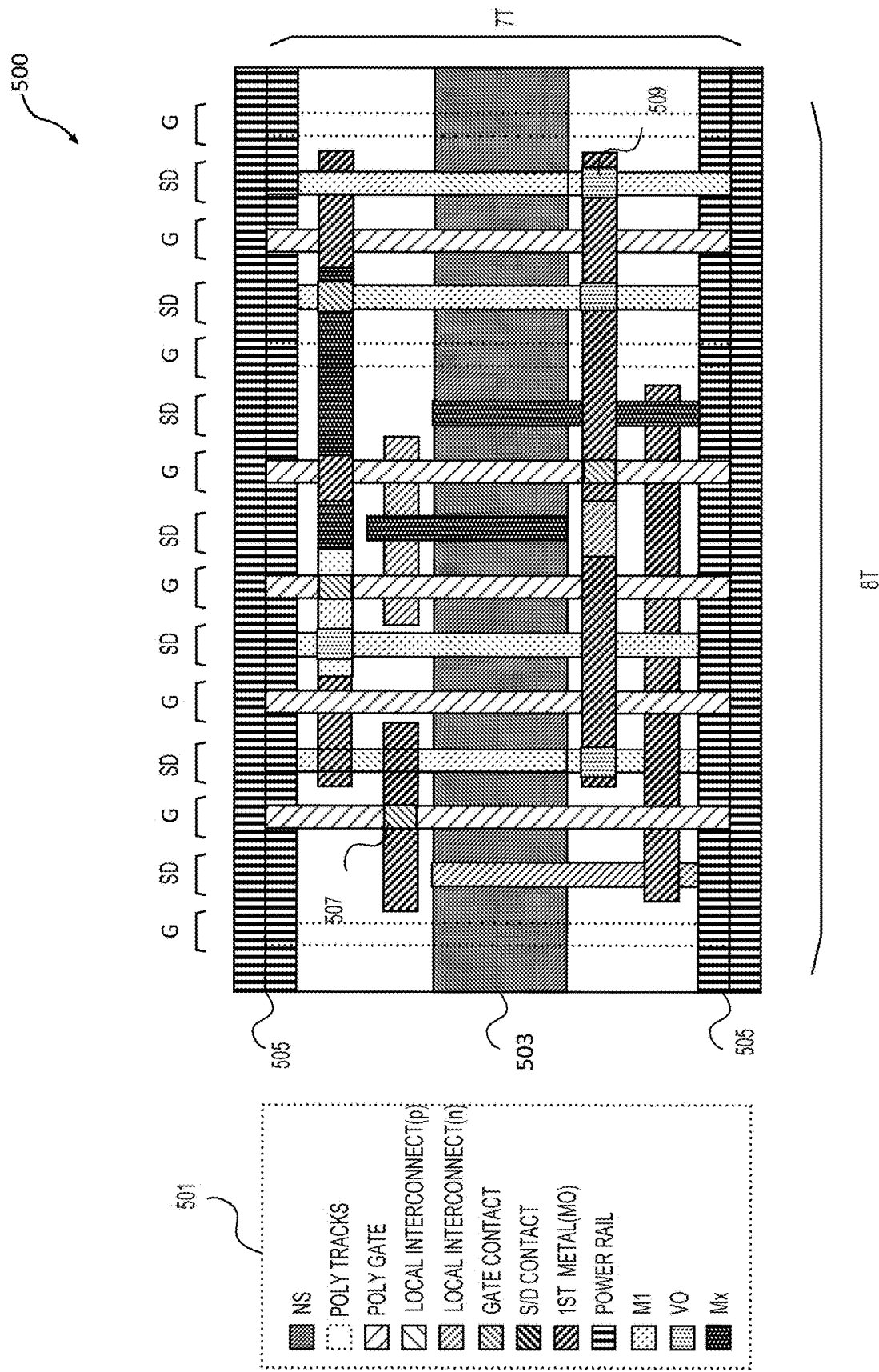
FIG. 5A is a top-down planar view of an XOR cell as used in gate-on-gate stacking.

FIG. 5A is a top-down planar view of an XOR cell which illustrates a 2D rendering of the XOR cell as used in gate-on-gate stacking. Legend 501 provides an indication of the structure and/or materials associated with different regions of the layout. As seen, a layout of the cell 500 may include multiple source-drain (SD) tracks arranged alternately with multiple gate (G) tracks along an east-west direction of the substrate and extending north-south to cross active region 503. As known to those skilled in the art, these alternating SD and G regions form an array of semiconductor devices in the east-west direction of the substrate. The cell boundary is formed by power rails 505 on the top and bottom, and poly gate tracks G on the far left and right side of the drawing. Examples of device contacts 507 and 509 are also shown. This gate-on-gate approach results in relatively large cell size and wiring complexity. In particular, the cell size is 7T (tracks) tall by 8 poly tracks wide as shown in FIG. 5A. Accordingly, three levels of metal are needed to complete the intra-cell wiring (M0, M1, and Mx). In a gate-on-gate stacking embodiment, these three wiring levels can be placed in a space between subsequent device tiers.

FIG. 5B is a vertical section view representing source-drain planes of the cell in FIG. 5A and FIG. 5C is a vertical section view representing gate planes of the cell in FIG. 5A. The structure 500 includes active region 503 and buried power rails 505 provided in the substrate below the active device plane. Intermediate power rails 506 are also provided. As also seen, a lower tier 511 of semiconductor devices, a wiring tier 513, a middle tier 515 of semiconductor devices, and a top tier of semiconductor devices 517 are stacked in a thickness direction on the substrate. The bottom layer 519 of a 2× routing track is also shown. As seen, the gate-on-gate stacking architecture of FIGS. 5A-5C includes five wiring levels in the wiring tier 513 between device planes. This configuration is disclosed in U.S. application Ser. No. 16/667,442 titled ARCHITECTURE FOR MONOLITHIC 3D INTEGRATION OF SEMICONDUCTOR DEVICES, the entire contents of which is incorporated herein by reference. As noted above, FIGS. 5A-5C show that implementing gate-on-gate 3D in a monolithic integration approach is made challenging by the large number of wiring levels (here 5 levels) that are required to be integrated in between the two device levels to successfully complete each cells intra-cell wiring as well as the required cell-to-cell wiring.

FIGS. 6A and 6B illustrate an overview of technology architecture that compactly renders complex logic cells such as the XOR logic function while minimizing pin access congestion problems in accordance with embodiments of the disclosure. FIG. 6A shows top-down layout views at two horizontal sections A and B taken through the Z axis of the cell, while 6B shows vertical sectional views 1-7 taken along the y axis at the seven planes numbered in FIG. 6A. The planar views of the structure 600 are not true sections along A and B, but rather show portions of the structure as transparent to illustrate structural features beneath planes A and B. Legend 601 is provided to associate structure and/or materials of FIG. 6A with the same structure and/or materials in FIG. 6B. As seen in the views of FIG. 6A, the cell size is 5T (tracks) tall by 6 poly tracks wide, providing significant scaling of the XOR cell relative to the gate-on-gate configuration of FIGS. 5A-5C. An overview of the various structural features that enable this scaling benefit are shown in FIG. 6B. As seen, the features include buried power rails BPR, power walls PW, local interconnect tabs LIT, wire runs M0, local interconnects LI, gate straps GS, vertical contacts VC, and a merged epitaxial structure ME.

As seen in section 1 of FIG. 6B, the structure 600 includes local interconnect tabs LIT that connect SD regions of the devices into "power-walls" PW rising up from the buried power-rails BPR. Details of such power walls are disclosed in Application Pub. No. US 2020/0075489 titled POWER DISTRIBUTION NETWORK FOR 3D LOGIC AND MEMORY, the entire disclosure of which is incorporated herein by reference. This feature is enabled by the transistor-on-transistor stacking that completes the entire complex logic cell in the device stack and leaves wiring (which would have to cross the power-wall) to the space above the device stack.

Referring now to section 2 of FIG. 6B, devices are implemented as "split gates", i.e. each transistor, even in the n/p pair, can be independently contacted. To facilitate a common connection to a pair of stacked gates, a new gate-to-gate strap GS is introduced. To be able to use the output of one transistor in the 3D arrangement as the signal input of another transistor, new "local interconnect" LI to gate constructs are introduced. As seen in section 3, to wire the output of a transistor in the top tier as the signal input for a transistor in the bottom tier, a vertical contact VC is introduced to strap the top local interconnect tab LIT to the bottom gate local interconnect LI.

As seen in section 4 of FIG. 6B, a split gate configuration is provided in which each transistor is able to receive a separate input signal. To facilitate this, a pair of variable height gate contacts VCs, and a staggered gate extensions are introduced. In section 5, to efficiently collect outputs of several vertically stacked transistors and route them to a common output pin, a merged epitaxial ME construct is introduced. The ME is shown as semi-transparent to visualize the stacked SD regions within the ME. In section 6, the flexibility of vertical connections VC being able to connect to wiring planes M0 above, as well as local interconnect LI planes below the transistor source or drain is shown. In section 7 of FIG. 6B, to strap a signal input from one transistor in the top tier to another in the bottom tier, a bottom-side vertical contact VC to the gate local interconnect LI is introduced.

Techniques herein will now be described in more detail with references to FIGS. 7 and 8A-8G. For convenience in explaining embodiments, the description will focus on the XOR logic function (exclusive or). The XOR logic function is an example of a complex or higher order logic cell, but use of other logic functions is contemplated herein.

Figure 7:
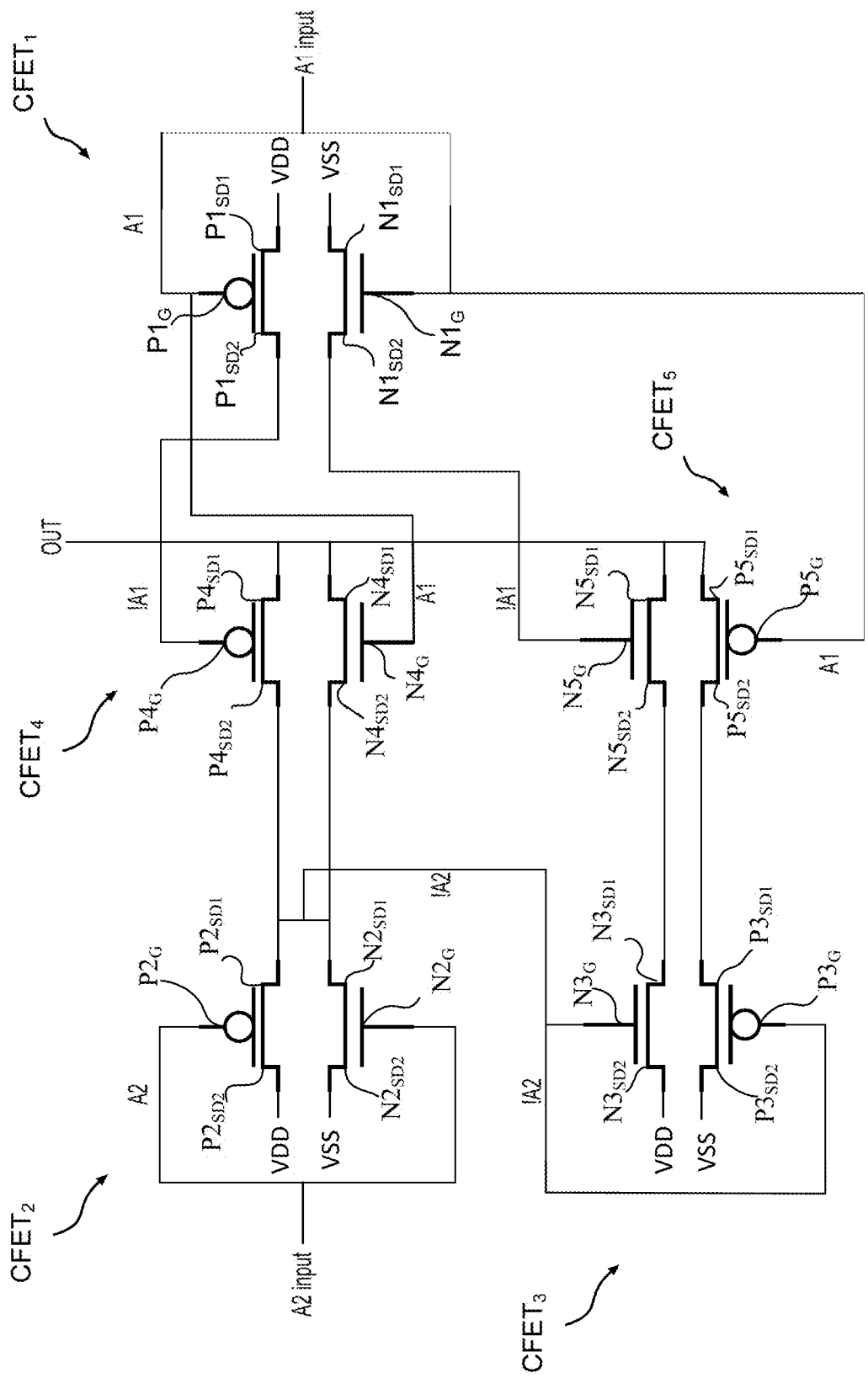
FIG. 7 is a detailed schematic of an XOR logic circuit having 5 C FETs, which may be implemented in accordance with embodiments of the disclosure.

FIG. 7 is a detailed schematic of the XOR logic circuit implemented with 5 complimentary field effect transistors (CFETs) numbered $CFET_1$-$CFET_5$. All 10 FETs of the circuit are shown. In FIG. 7, the designator Px designates the P-type transistor of the x numbered CFET, and Nx designates the N-type transistor of the x numbered CFET. Further, SD1 designates the first source/drain region of the associated transistor, SD2 designates the second source/drain region of the associated transistor, and G designates the gate of the associated transistor. For example, "$P1_{SD1}$" refers to the first SD region of the P-type transistor of the CFET numbered 1, while "$N1_{SD2}$" refers to the second SD region of the N-type transistor of the CFET numbered 1. Similarly, "$P1_G$" refers to the gate region of the P-type transistor for the CFET numbered 1. These CFETs are implemented as stacked CFET structures as will be discussed further below. FIG. 7 schematically shows the necessary intra-cell connections (thin lines) formed by local interconnects and contacts as also discussed below.

FIGS. 8A-8G are detailed views of sections 1-7 of FIG. 6A respectively in accordance with embodiments of the present disclosure. The labeling convention of FIGS. 6A and 6B is continued throughout FIGS. 8A-8G. Legend 601 and the planar views of FIG. 6A are reproduced for reference in each of FIGS. 8A-8G. These planar views of the structure 800 are not true sections along A and B, but rather show portions of the structure 800 as transparent to illustrate structural features beneath the plane A and B.

Figure 8A:
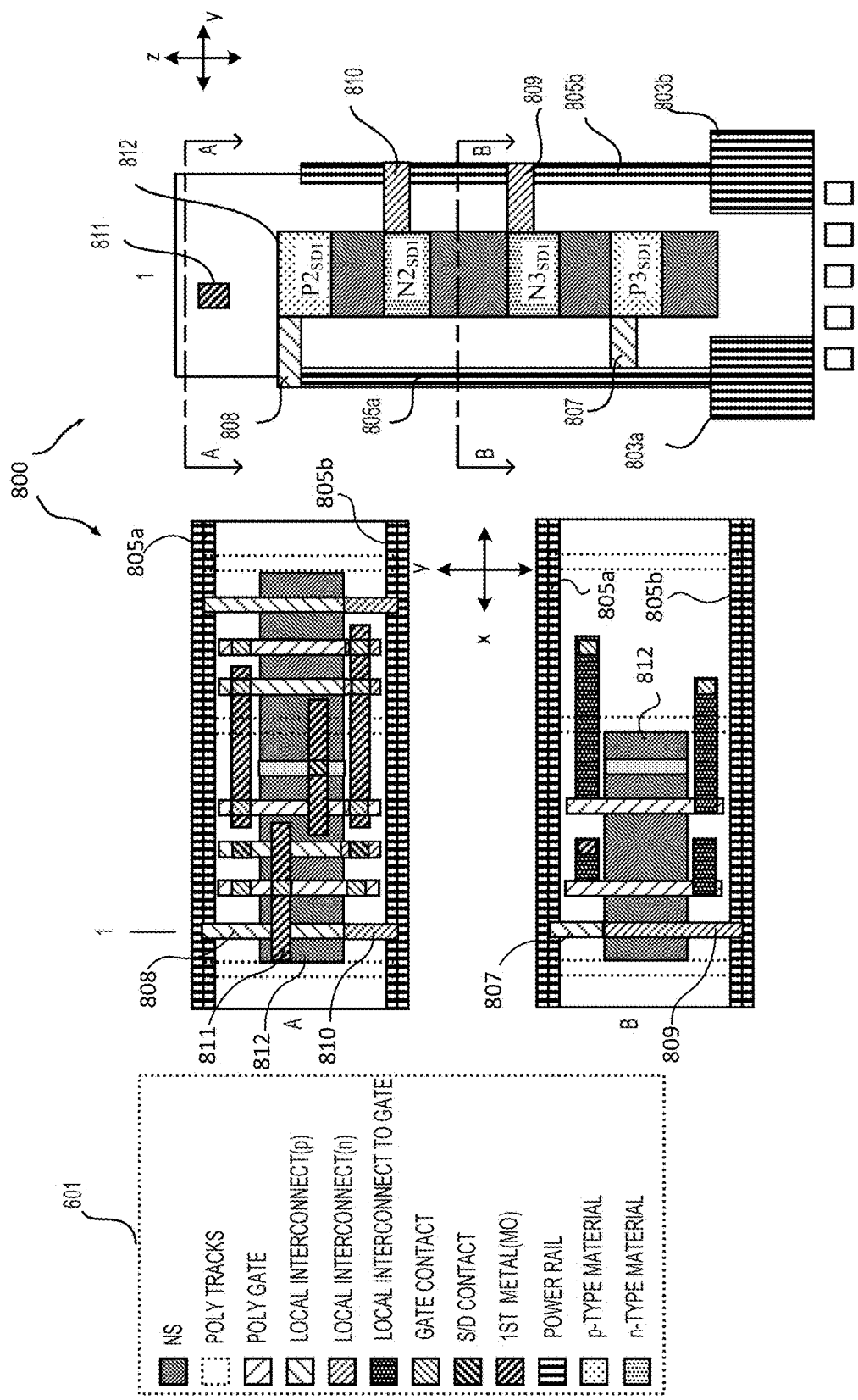
FIG. 8A is a detailed view of vertical section 1 of an XOR cell in accordance with embodiments of the present disclosure.

FIG. 8A is a detailed view of vertical section 1 of an XOR cell in accordance with embodiments of the present disclosure. The structure 800 represents a portion of a monolithic semiconductor substrate having a generally planar substrate surface. As seen, the structure 800 includes buried power rail 803a which serves as VDD delivering power to p-type transistors, and buried power rail 803b serving as VSS delivering power to n-type transistors. SD regions $P3_{SD1}$, $N3_{SD1}$, $N2_{SD1}$, $PN2_{SD1}$ are sequentially stacked over one another in a direction of thickness of the substrate 801. In the embodiment of FIG. 8A, the SD regions of the transistors are stacked collinearly within an active device column 812 of the structure. Further, SD regions $P3_{SD1}$ and $N3_{SD1}$ form a complementary pair of SD regions associated with $CFET_3$ of the XOR cell, while $P2_{SD1}$ and $N2_{SD1}$ form a complementary pair of SD regions associated with $CFET_2$ of the XOR cell. Thus, the stacked transistor pairs are configured in an alternating stack orientation by doping type of the transistors. This alternating of stack orientation (i.e. n-over-p, then p-over-n) improves implant and work-function deposition efficiency. Alternating orientation can improve process efficiency for implants and device type specific selective depositions as compared to maintaining a same stacking order for all device pairs in the stack (n-p n-p).

Several local interconnect and contact structures are provided to electrically connect the semiconductor devices as necessary to form the XOR circuit. Specifically, buried power rail 803a is connected to $P3_{SD1}$ and $P2_{SD1}$ by way of power wall 805a and horizontal interconnect tabs 807 and 808 respectively, while buried power rail 803b is connected to $N3_{SD1}$ and $N2_{SD1}$ by way of power wall 805b and horizontal interconnect tabs 809 and 810 respectively. Wire 811 of the M0 layer is also shown. The structural features of FIG. 8A are shown in the planar view reproduced from FIG. 6A, which are partially transparent to illustrate structural features beneath the plane A and B. For example, planar view A shows local interconnect tab 808 as well as local interconnect tab 810 on a plane below that of 808. Similarly, planar view B shows local interconnect tab 809 as well as local interconnect tab 807 on a plane below that of 809.

Figure 8B:
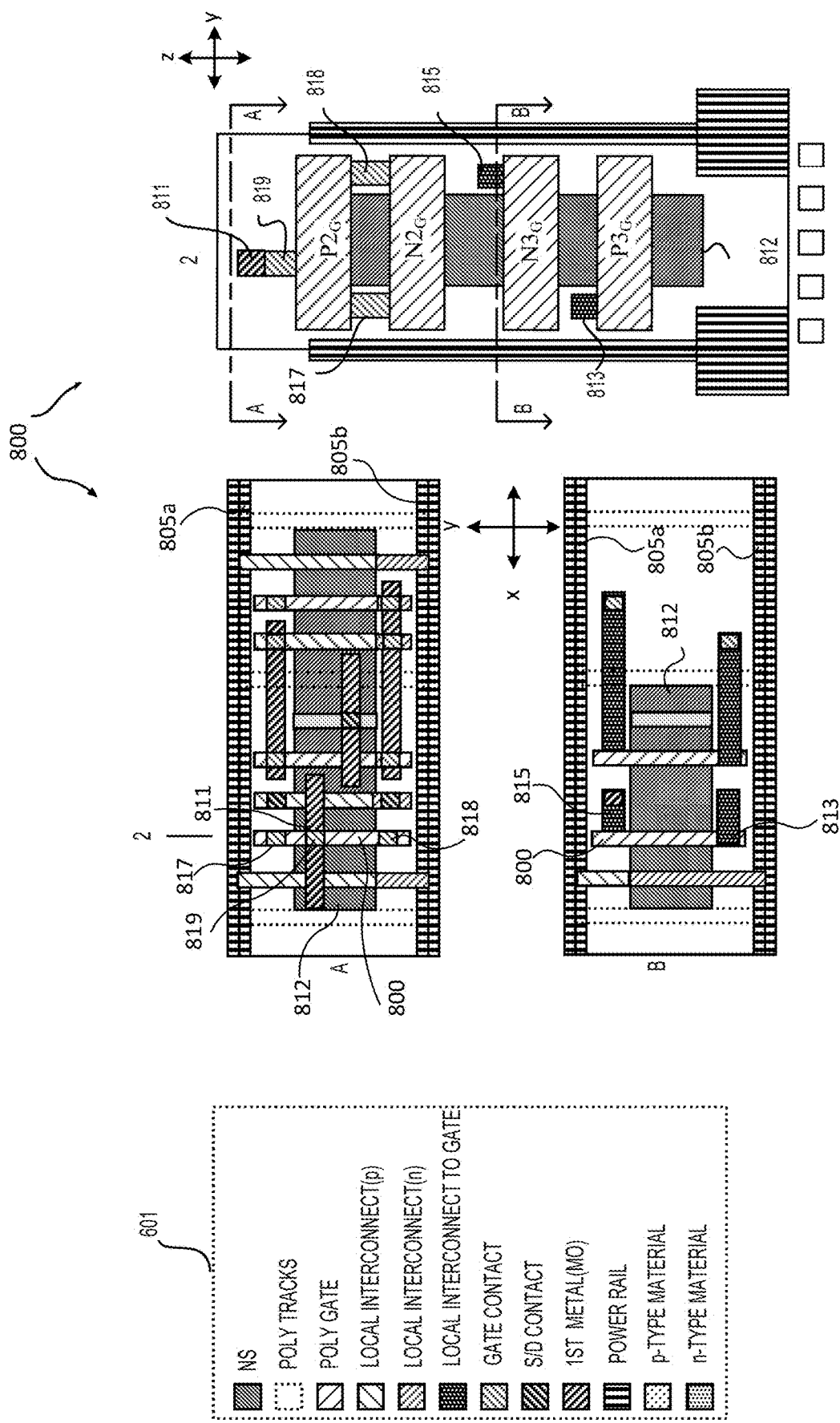
FIG. 8B is a detailed view of vertical section 2 of an XOR cell in accordance with embodiments of the present disclosure.

FIG. 8B is a detailed view of vertical section 2 of an XOR cell in accordance with embodiments of the present disclosure. As seen, gate regions $P3_G$, $N3_G$, $N2_G$, and $P2_G$ are sequentially stacked over one another in a direction of thickness of the substrate. As noted in FIG. 6 above, these gate regions are implemented as split gates so that each gate region can be independently contacted. In the embodiment of FIG. 8B, the gate regions of the transistors are stacked collinearly. Local interconnects 813 and 815 extend in the y direction to connect with gate regions $PS_G$, $NS_G$ as discussed below. Gate-to-gate straps 817 and 818 provide a common connection to the $P2_G$, and $N2_G$ pair of stacked gates. Further, gate contact 819 connects with wire 811 to provide the A2 input to the XOR cell. Thus, transparency of planar view A shows wire 811, as well as gate contact 819 beneath the wire and gate strap 817 beneath $P2_G$. Similarly, transparency of planar view B shows interconnect 815 as well as interconnect 813 beneath $P3_G$.

FIG. 8C is a detailed view of vertical section 3 of an XOR cell in accordance with embodiments of the present disclosure. As seen, SD regions $P3_{SD2}$, $N3_{SD2}$, $N2_{SD2}$, $P2_{SD2}$ are sequentially stacked over one another collinearly within an active device column 812 of the structure. That is, $P3_{D2}$, $N3_{SD2}$, $N2_{DS}$, $P2_{SD2}$ form the second SD regions for the transistors of $CFET_3$ and $CFET_2$ of the XOR cell. Further, SD regions $P3_{SD2}$, $N3_{ASD2}$, $N2_{SD2}$, and $P2_{SD}7$ are each formed as a common source-drain with $P5_{SD1}$, $N5_{SD1}$, $N4_{SD1}$, $P4_{SD1}$ respectively, which form the first drain regions for the transistors of $CFET_5$ and $CFET_4$ of the XOR cell. As also seen, the common SD region forming $P2_{SD2}$ and $P4_{SD1}$ are connected through horizontal interconnect tab 821 and vertical contact 823 to local interconnect 815 in the lower tier of CFETs. Similarly, the common SD region forming $N2_{SD2}$ and $N4_{SD1}$ are connected through horizontal interconnect tab 825 and vertical contact 827 to local interconnect 813. Thus transparency of planar view A shows wire 811, as well as interconnect tab 821 and SD contact 823 beneath $N3_{SD2}$. Similarly, transparency of planar view B shows interconnect 813, as well as interconnect 815 beneath $P3_{SD2}$.

Figure 8D:
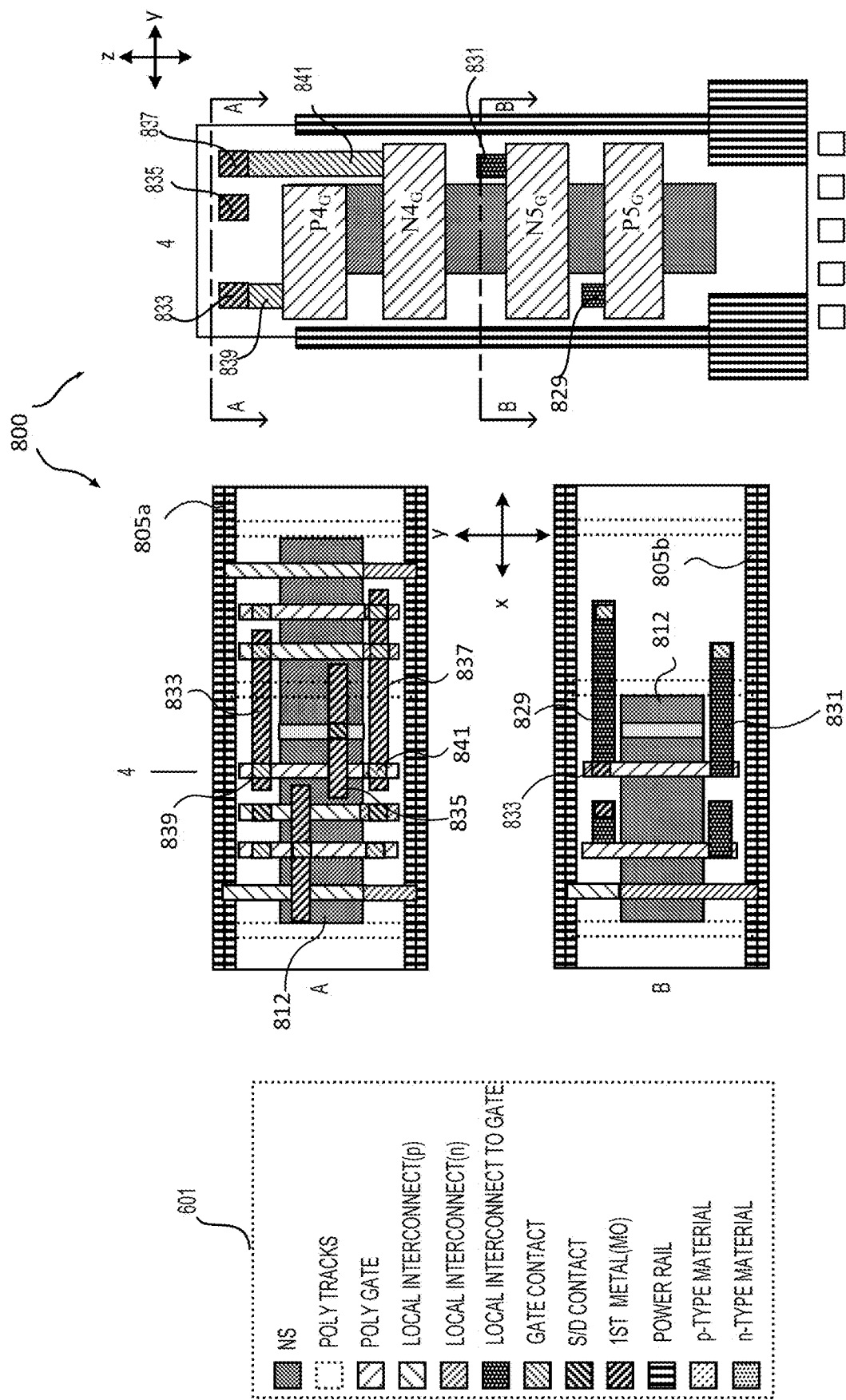
FIG. 8D is a detailed view of vertical section 4 of an XOR cell in accordance with embodiments of the present disclosure.

FIG. 8D is a detailed view of vertical section 4 of an XOR cell in accordance with embodiments of the present disclosure. As seen, split gate regions $P5_G$, $N5_G$, $N4_G$, and $P4_G$ are sequentially stacked over one another in a direction of thickness of the substrate. Further, gate Regions $P4_G$, and $N4_G$ are staggered from each other such that variable height gate contacts 839 and 841 can provide contact with wire 833 and 837 of the M0 level of top wiring. Wire 835 is also shown. Split gate regions $PS_G$ and $NS_G$, are connected to gate contacts 829 and 831 respectively.

Figure 8E:
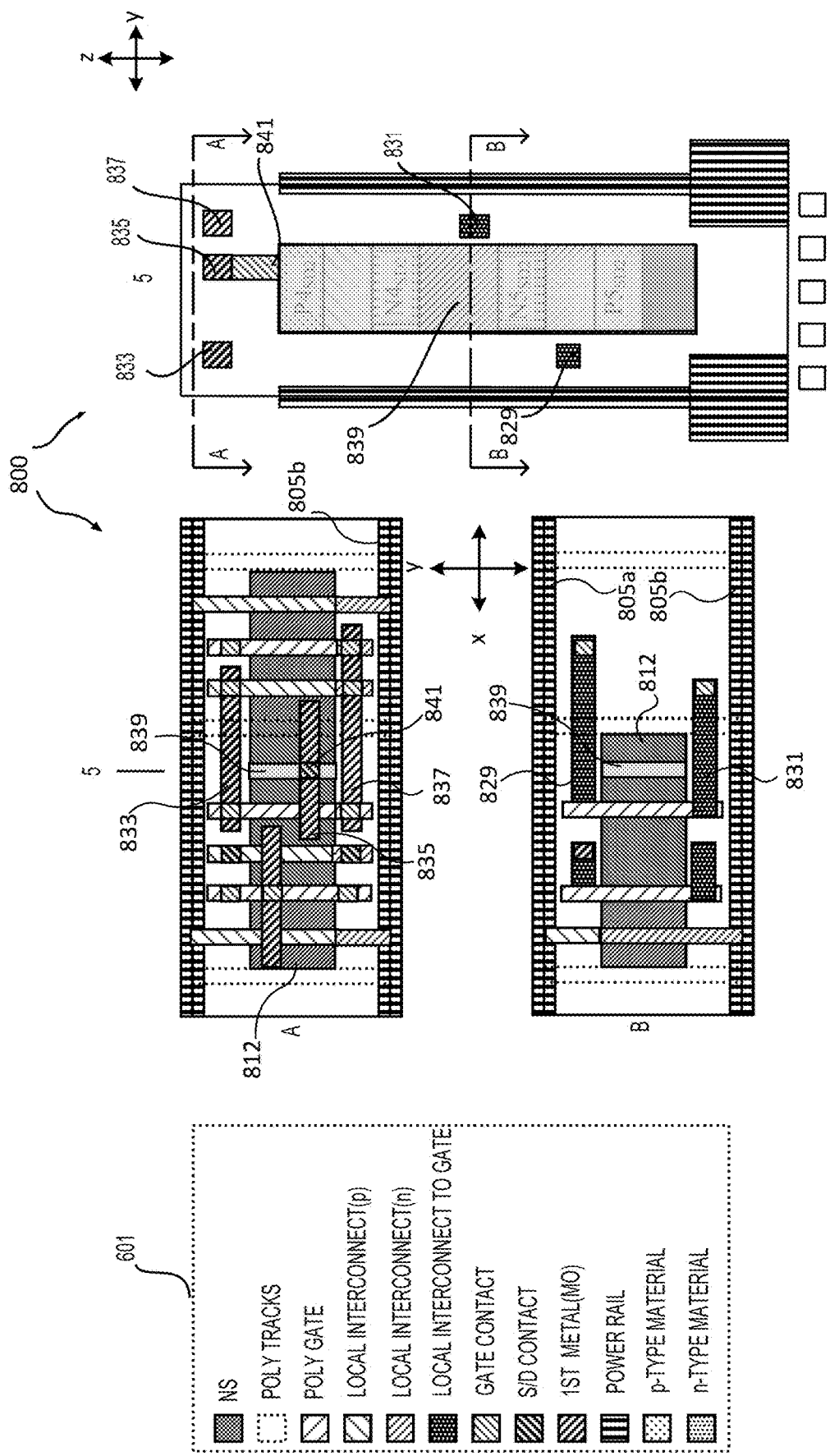
FIG. 8E is a detailed view of vertical section 5 of an XOR cell in accordance with embodiments of the present disclosure.

FIG. 8E is a detailed view of vertical section 5 of an XOR cell in accordance with embodiments of the present disclosure. As seen, SD regions $P5_{SD2}$, $N5_{SD2}$, $N4_{SD2}$, and $P4_{SD2}$ are sequentially stacked over one another collinearly within an active device column 812 of the structure. That is, $P5_{SD2}$, $N5_{SD2}$, $N4_{SD2}$, and $P4_{SD2}$ form the second SD regions for the transistors of CFETs 5 and 4 of the XOR cell. Further, these SD regions are provided as a merged epitaxial growth region 839 to efficiently collect outputs of several vertically stacked transistors and route them to a common output pin of the XOR circuit. This output is provided by SD contact 841 and wire 835 of M0.

FIG. 8F is a detailed view of vertical section 6 of an XOR cell in accordance with embodiments of the present disclosure. As seen, SD regions $N1_{SD1}$, $P1_{SD1}$ are sequentially stacked over one another collinearly within an active device column 812 of the structure. That is, $N1_{SD1}$, $P1_{SD1}$ form the first SD regions for the transistors of $CFET_1$ of the XOR cell. As also seen, common SD region $P1_{SD1}$ is connected through horizontal interconnect tab 843 and vertical contact 845 to wire 833. Similarly, the SD region forming $N1_{SD1}$ is connected through horizontal interconnect tab 847 and vertical SD contact 849 to local interconnect 831. Local interconnect 829 is also shown. Thus, transparency of planar view A shows wire 833, as well as interconnect tab 843 and SD contact 845. Similarly, transparency of planar view B shows interconnect tab 847, as well as contact 849 and interconnect 831.

Figure 8G:
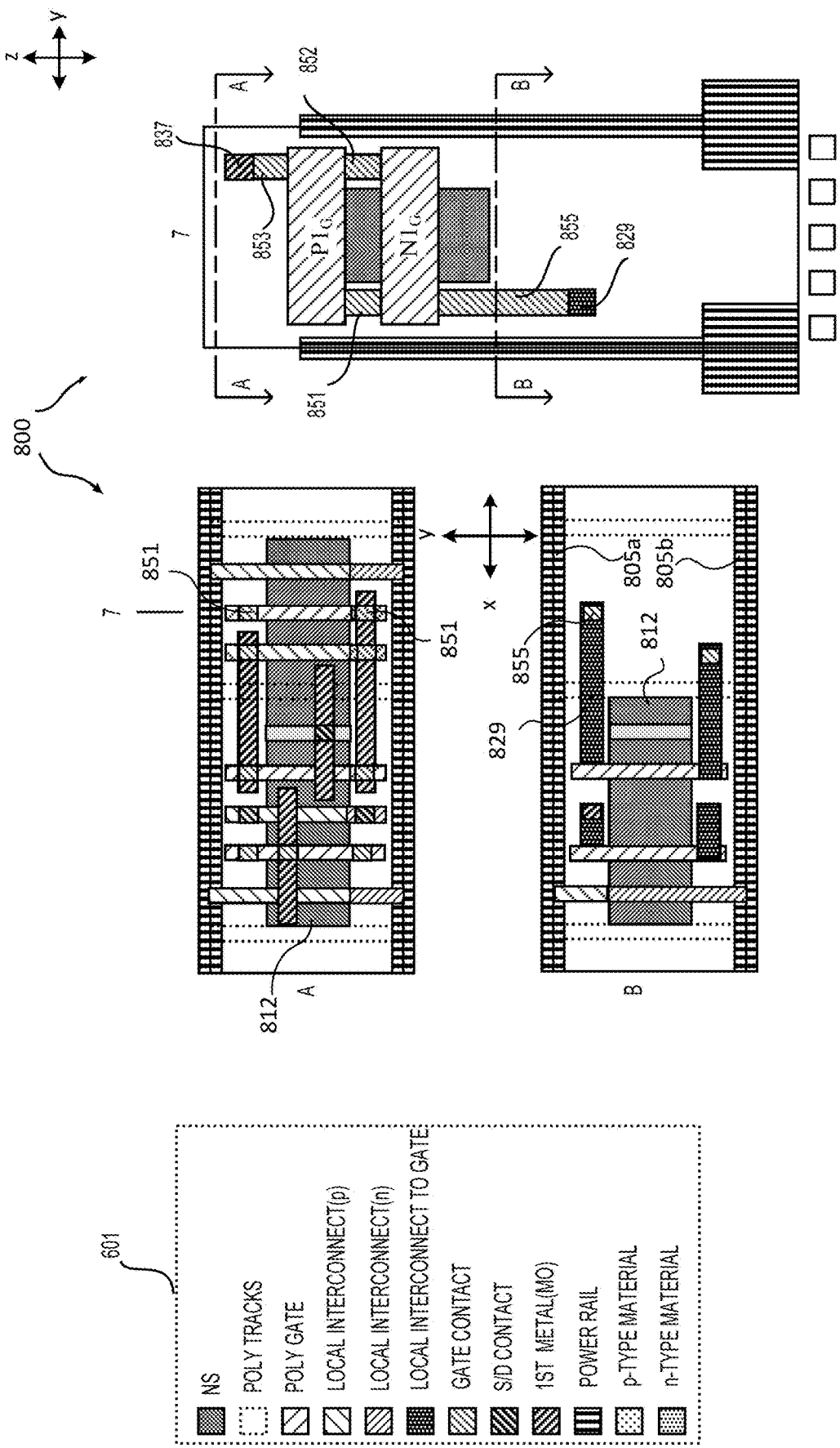
FIG. 8G is a detailed view of vertical section 7 of an XOR cell in accordance with embodiments of the present disclosure.

FIG. 8G is a detailed view of vertical section 7 of an XOR cell in accordance with embodiments of the present disclosure. As seen, gate regions $N1_G$ and $P1_G$ are sequentially stacked over one another in a direction of thickness of the substrate. In the embodiment of FIG. 8G, the gate regions of the transistors are stacked collinearly. Gate-to-gate straps 851 and 852 provide a common connection to the $P1_G$, and $N1_G$ pair of stacked gates. Further, gate contact 853 connects with wire 837 to provide part of the A1 input to the XOR cell. Gate contact 855 connects the common gates to local interconnect 829. Thus, transparency of planar view A shows wire 837, as well as gate contact 853 beneath the wire and gate strap 851 beneath $N1_G$. Similarly, transparency of planar view LB shows interconnect 829 as well as gate contact 855 beneath $N1_G$.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

The invention claimed is:

1. A three-dimensional (3D) integrated circuit (IC) comprising:
a substrate having a substrate surface;
a power rail provided in the substrate;
a first semiconductor device provided in the substrate and positioned over the power rail along a thickness direction of the substrate which is substantially perpendicular to the substrate surface, the first semiconductor device having a first gate and a first pair of source-drain regions provided on opposite sides of the first gate in a horizontal direction along the substrate surface;
a second semiconductor device provided in the substrate and stacked over the first semiconductor device along the thickness direction, the second semiconductor device having a second gate and a second pair of source-drain regions provided on opposite sides of the second gate in a horizontal direction along the substrate surface, the first gate being physically separated from the second gate;
wherein the first gate has a top surface in a first plane perpendicular to the thickness direction, and the second gate has a bottom surface in a second plane perpendicular to the thickness direction such that a first facing portion of the top surface is directly opposite to a second facing portion of the bottom surface; and
a conductive gate-to-gate strap connection including a vertical contact extending from the first facing portion to the second facing portion such that the vertical contact is contained between the facing portions and the first gate is electrically connected to the second gate.

2. The 3D IC of claim 1 wherein the first and second gates are stacked collinearly.

3. The 3D IC of claim 2 wherein the gate-to-gate strap connection comprises a plurality of the vertical contacts which are physically separated from each other.

4. The 3D IC of claim 1 wherein the first and second gates are stacked in a staggered arrangement.

5. The 3D IC of claim 1, further comprising a merged epitaxial structure which connects a source-drain region of the first semiconductor device with a source-drain region of the second semiconductor device.

6. The 3D IC of claim 5, wherein the merged epitaxial structure is configured to provide a common output pin from the 3D IC.

7. The 3D IC of claim 1, further comprising a power wall extending vertically from the power rail.

8. A three-dimensional (3D) integrated circuit (IC) comprising:
- a substrate having a substrate surface;
- a power rail provided in the substrate;
- a first semiconductor device provided in the substrate and positioned over the power rail along a thickness direction of the substrate which is substantially perpendicular to the substrate surface, the first semiconductor device having a first gate and a first pair of source-drain regions provided on opposite sides of the first gate in a horizontal direction along the substrate surface;
- a second semiconductor device provided in the substrate and stacked over the first semiconductor device along the thickness direction, the second semiconductor device having a second gate and a second pair of source-drain regions provided on opposite sides of the second gate in a horizontal direction along the substrate surface, the first gate being physically separated from the second gate;
- a conductive gate-to-gate strap connection extending from the first gate to the second gate such that the first gate is electrically connected to the second gate, wherein the first and second gates are stacked in a staggered arrangement;
- a first gate contact connected to the first gate, and
- a second gate contact connected to the second gate, the first gate contact having a greater vertical height as compared to the second gate contact.

9. The 3D IC of claim 8, further comprising a wiring layer provided in the substrate and positioned over the second semiconductor device along the thickness direction, wherein the first and second gate contacts each extend vertically to connect with the wiring layer.

10. A three-dimensional (3D) integrated circuit (IC) comprising:
- a substrate having a substrate surface;
- a first stack of semiconductor devices stacked along a thickness direction of the substrate,
- a second stack of semiconductor devices stacked along the thickness direction of the substrate and provided adjacent to the first stack in a direction along the substrate surface, wherein each semiconductor device of the first and second stack comprises a respective gate and a pair of source-drain regions provided on opposite sides of the respective gate in a direction along the substrate surface, and each gate of the first and second stack is a split gate; and
- a gate contact physically connected to a first split gate of a first one of the semiconductor devices, wherein the gate contact forms at least part of a local interconnect structure that electrically connects the first one of the semiconductor devices to a second one of the semiconductor device in the 3D IC.

11. The 3D IC of claim 10, wherein the first and second semiconductor devices are sequentially stacked in the first stack of semiconductor devices.

12. The 3D IC of claim 11, wherein the gate contact is a gate-to-gate strap that extends vertically from the first split gate to a second split gate of the second semiconductor device such that the first and second semiconductor devices are electrically connected.

13. The 3D IC of claim 12, further comprising:
- a wiring layer provided over the first and second stacks of semiconductor devices in the thickness direction; and
- a vertical contact extending vertically from the second split gate to provide a common input to the first and second semiconductor devices.

14. The 3D IC of claim 11, wherein the first split gate is staggered in relation to a second split gate of the second semiconductor device.

15. The 3D IC of claim 14, further comprising:
- a wiring layer provided over the first and second stacks of semiconductor devices in the thickness direction;
- a first vertical contact extending vertically from the first split gate to the wiring layer; and
- a second vertical contact extending vertically from the second split gate to the wiring layer, wherein the first vertical contact has greater height than the second vertical contact.

16. The 3D IC of claim 10, wherein the first and second semiconductor devices are provided in the first and second stacks respectively.

17. The 3D IC of claim 16, wherein the local interconnect structure electrically connects the first split gate to a second split gate in the second stack of semiconductor devices.

18. The 3D IC of claim 17 wherein the gate contact comprises a horizontal interconnect structure that extends from the first stack to the second stack along the substrate surface.

19. The 3D IC of claim 17, wherein the local interconnect structure electrically connects the first split gate to a source-drain region of a semiconductor device in the second stack.

20. The 3D IC of claim 19, wherein the gate contact comprises a horizontal interconnect structure that extends from the first stack to the second stack along the substrate surface.

21. The 3D IC of claim 20, further comprising a local interconnect tab extending from the source-drain region in the direction along the substrate surface, wherein a vertical contact extends vertically from the first split gate to the local interconnect tab.

* * * * *